(12) United States Patent
Li et al.

(10) Patent No.: US 11,398,539 B2
(45) Date of Patent: Jul. 26, 2022

(54) ARRAY SUBSTRATE, DISPLAY PANEL AND DISPLAY DEVICE

(71) Applicant: BOE TECHNOLOGY GROUP CO., LTD., Beijing (CN)

(72) Inventors: Pan Li, Beijing (CN); Yong Qiao, Beijing (CN); Xueguang Hao, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 357 days.

(21) Appl. No.: 16/608,786

(22) PCT Filed: Apr. 4, 2019

(86) PCT No.: PCT/CN2019/081587
§ 371 (c)(1),
(2) Date: Oct. 25, 2019

(87) PCT Pub. No.: WO2019/223434
PCT Pub. Date: Nov. 28, 2019

(65) Prior Publication Data
US 2021/0167159 A1 Jun. 3, 2021

(30) Foreign Application Priority Data
May 23, 2018 (CN) .......................... 201820777664.2

(51) Int. Cl.
*H01L 27/32* (2006.01)
*H01L 27/02* (2006.01)

(52) U.S. Cl.
CPC ...... *H01L 27/3276* (2013.01); *H01L 27/0248* (2013.01); *H01L 27/3218* (2013.01); *H01L 2227/323* (2013.01)

(58) Field of Classification Search
CPC .................................................. H01L 27/3276
See application file for complete search history.

(56) References Cited

U.S. PATENT DOCUMENTS 9,793,246 B1 * 10/2017 Tseng .................... H01L 25/105
2005/0121789 A1 6/2005 Madurawe
(Continued)

FOREIGN PATENT DOCUMENTS

| CN | 106653796 A | 5/2017 |
| CN | 107731846 A | 2/2018 |

(Continued)

OTHER PUBLICATIONS

International Search Report and Written Opinion dated Jun. 27, 2019, from application No. PCT/CN2019/081587.
(Continued)

*Primary Examiner* — Douglas M Menz
(74) *Attorney, Agent, or Firm* — Arch & Lake LLP

(57) ABSTRACT

Arrangements of the present disclosure relate to an array substrate, a display panel and a display device. The array substrate includes a circuit region and a boundary region. The circuit region includes a plurality of stacked conductive layers and an interlayer dielectric disposed between every two adjacent conductive layers. One or more first via holes are provided on the interlayer dielectric. The boundary region is disposed outside the circuit region. One or more second via holes for improving uniformity of the first via holes in the circuit region are disposed within a preset range of the boundary region close to one side of the circuit region. The second via holes and the first via holes are disposed on the same interlayer dielectric.

19 Claims, 3 Drawing Sheets

(56) References Cited

U.S. PATENT DOCUMENTS

| | | | |
|---|---|---|---|
| 2009/0289369 A1* | 11/2009 | Fang | H01L 27/1052 |
| | | | 257/758 |
| 2015/0371947 A1* | 12/2015 | Chen | H01L 21/76898 |
| | | | 257/774 |
| 2016/0190180 A1* | 6/2016 | Ma | H01L 27/124 |
| | | | 257/40 |
| 2017/0025601 A1 | 1/2017 | Bhushan et al. | |
| 2017/0033005 A1 | 2/2017 | Watanabe | |
| 2017/0125505 A1 | 5/2017 | Oh | |
| 2017/0154936 A1 | 6/2017 | Jo et al. | |
| 2017/0154943 A1* | 6/2017 | Yang | H01L 27/3276 |
| 2019/0074290 A1 | 3/2019 | Xiao et al. | |

FOREIGN PATENT DOCUMENTS

| | | |
|---|---|---|
| CN | 207116434 U | 3/2018 |
| CN | 107910333 A | 4/2018 |
| CN | 208489194 U | 2/2019 |
| JP | 2010-251754 A | 11/2010 |
| JP | 2011-076804 A | 4/2011 |
| KR | 100772251 B1 * | 11/2007 |
| KR | 102170051680 A | 5/2017 |
| WO | WO-2019/042071 A1 | 3/2019 |

OTHER PUBLICATIONS

First Office Action issued to Indian Application No. 201927049214 dated Jul. 30, 2021 with English translation, (12p).

Second Office Action issued to Korean Application No. 10-2019-7032487 dated Mar. 5, 2021 with English translation, (12p).

Korean Office Action dated Sep. 17, 2020, from application No. 10-2019-7032487.

First Office Action issued to Indian Application No. 201927049214 dated Jul. 30, 2021 with English translation, (5p).

* cited by examiner

ARRAY SUBSTRATE, DISPLAY PANEL AND DISPLAY DEVICE

CROSS-REFERENCE TO RELATED APPLICATIONS

The present application is based on International Application No. PCT/US2019/081587, filed on Apr. 4, 2019, which is based upon and claims priority to Chinese Application No. 201820777664.2, filed May 23, 2018 and entitled "ARRAY SUBSTRATE, DISPLAY PANEL AND DISPLAY DEVICE", the entire content of each of which are herein incorporated by reference in their entireties.

TECHNICAL FIELD

The present disclosure relates to the field of display technology, and more particularly, to an array substrate, a display panel and a display device.

BACKGROUND

As display panels trend toward lightness, low energy consumption and portability, a new generation of display technology represented by Organic Light-Emitting Diodes (OLED) has received more and more attention. Compared with Liquid Crystal Display (LCD) display technology, the OLED displays have advantages of lightness, low power consumption, low drive voltage, better angle of view and contrast and fast response speed.

The foregoing information disclosed in Background is only for better understanding of the background of the present disclosure and therefore it can include information that does not constitute the relevant technology already known to those of ordinary skill in the art.

SUMMARY

According to a first aspect of the present disclosure, there is provided an array substrate. The array substrate includes a circuit region including a plurality of stacked conductive layers and an interlayer dielectric disposed between every two adjacent conductive layers. First via holes are provided on the interlayer dielectric. The array substrate includes a boundary region disposed outside the circuit region. Second via holes for improving the uniformity of the first via holes in the circuit region are disposed within a preset range of the boundary region close to one side of the circuit region. The second via holes and the first via holes are disposed on the same interlayer dielectric.

According to an arrangement of the present disclosure, the first via holes in the circuit region have the same density as that of the second via holes in the boundary region.

According to an arrangement of the present disclosure, the first via holes in the circuit region have the same shape as or a different shape from that of the second via holes in the boundary region.

According to an arrangement of the present disclosure, the shape of the second via holes in the boundary region is any one or more of a circular shape, a strip shape, a rectangular shape or an irregular shape.

According to an arrangement of the present disclosure, the first via holes in the circuit region have the same distribution as that of the second via holes in the boundary region.

According to an arrangement of the present disclosure, the circuit region includes any one or more of a display circuit region, a driver circuit region and an electro-static discharge circuit region.

According to an arrangement of the present disclosure, the boundary region includes any one or two of a lead region, a fan-out region and a binding region.

According to an arrangement of the present disclosure, the circuit region includes a first circuit region and a second circuit region which are disposed adjacent to each other, and the boundary region is a gap region between the first circuit region and the second circuit region.

According to an arrangement of the present disclosure, the circuit region includes a plurality of pixels or sub-pixels. A width of the preset range is larger than that of a first edge of the pixels or sub-pixels.

According to an arrangement of the present disclosure, the plurality of conductive layers include: a source and drain metal layer and a gate metal layer. The interlayer dielectric is disposed on the source and drain metal layer and/or the gate metal layer.

According to a second aspect of the present disclosure, there is provided a display panel including the array substrate described in any of the above arrangements.

According to a third aspect of the present disclosure, there is provided a display device including the display panel described in any of the above arrangements.

According to a fourth aspect of the present disclosure, there is provided a method for manufacturing an array substrate. The array substrate includes a circuit region and a boundary region disposed outside the circuit region, the circuit region includes a plurality of stacked conductive layers and an interlayer dielectric disposed between every two adjacent conductive layers, and the method includes: providing first via holes on the interlayer dielectric; and disposing, second via holes for improving uniformity of the first via holes in the circuit region, within a preset range of the boundary region close to one side of the circuit region. The second via holes and the first via holes are disposed on the same interlayer dielectric.

According to an arrangement of the present disclosure, the first via holes in the circuit region have the same density as that of the second via holes in the boundary region.

According to an arrangement of the present disclosure, the first via holes in the circuit region have the same shape as or a different shape from that of the second via holes in the boundary region.

According to an arrangement of the present disclosure, the shape of the second via holes in the boundary region is any one or more of a circular shape, a strip shape and a rectangular shape.

According to an arrangement of the present disclosure, the first via holes in the circuit region have the same distribution as that of the second via holes in the boundary region.

According to an arrangement of the present disclosure, the circuit region includes any one or more of a display circuit region, a driver circuit region and an electro-static discharge circuit region.

According to an arrangement of the present disclosure, the boundary region includes any one or two of a lead region, a fan-out region and a binding region.

It is to be understood that both the foregoing general description and the following detailed description are exemplary and explanatory only and are not restrictive of the disclosure.

BRIEF DESCRIPTION OF THE DRAWINGS

The accompanying drawings, which are incorporated in and constitute a part of this specification, illustrate arrangements consistent with the utility model and, together with the description, serve to explain the principles of the utility model.

DETAILED DESCRIPTION

Figure 1:
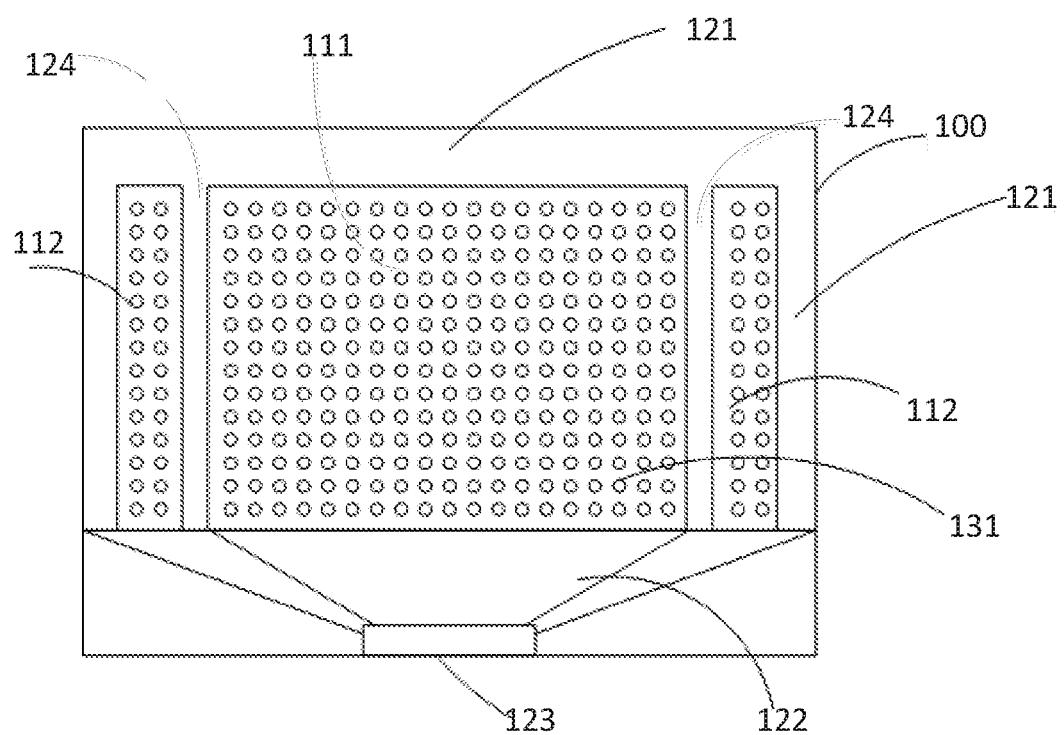
FIG. 1 is a view schematically illustrating an array substrate in the relevant technology.

The exemplary implementations will now be described more fully with reference to the accompanying drawings. However, the exemplary implementations may be implemented in various forms and should not be constructed as being limited to the implementations set forth herein; rather, the implementations are provided so that the disclosure will be thorough and complete, and will fully convey the conception of exemplary implementations to those skilled in the art. The drawings are only schematic representations of the disclosure, and are not necessarily drawn to scale. The same reference numerals throughout the drawings denote the same or like parts, thus their detailed description will be omitted.

In addition, the features, structures or characteristics described herein can be included in one or more arrangements in any appropriate way. In the description hereinafter, many specific details are provided for fully understanding of the arrangements of the present disclosure. However, it will be appreciated by those skilled in the art that the technical solution of the present disclosure can be practiced without one or more of the specific details, or with other methods, components, devices, or steps, etc. In addition, known structures, methods, devices, implementations, materials or operations will not be illustrated or described in detail, to avoid obscuration of the aspects of the present disclosure.

Some of the block diagrams shown in the drawings are functional entities and are not necessarily corresponding to physically or logically separate entities. These functional entities may be implemented in software, or implemented in one or more hardware modules or integrated circuits, or implemented in different network and/or processor devices and/or microcontroller devices.

The implementations set forth in the following description of exemplary arrangements do not represent all implementations consistent with the utility model. Instead, they are merely examples of devices and methods consistent with aspects related to the utility model as recited in the appended claims.

FIG. 1 is a view schematically illustrating an array substrate in the relevant technology.

FIG. 1 shows a schematic view illustrating distribution of ILD (InterLayer Dielectric) via holes (i.e., first via holes 131 in FIG. 1) of an array substrate 100 of an OLED in relevant technology. The array substrate 100 can include a circuit region and a boundary region disposed outside the circuit region.

For example, the circuit region can include any one or more of a display circuit region 111, a driver circuit region 112 (such as Gate driver on Array, hereinafter referred to as a GOA region) and an Electro-Static discharge (ESD) circuit region (not shown).

For example, the boundary region can include any one or more of a lead region 121, a fan-out region 122, a binding region 123 and a gap region 124 between the display circuit region 111 and the driver circuit region 112. The first via holes 131 are provided in the display circuit region 111, the driver circuit region 112 and the electro-static discharge circuit region (the ILD via holes are taken as an example herein, but the present disclosure is not limited thereto).

In relevant technology, the first via holes 131 will generally be formed in the regions such as the display circuit region 111, the GOA region 112 and the ESD region, and gaps generally exist between these regions. ILD layers will be formed in the gap regions and/or the lead region 121 and/or the fan-out region 122 and/or the binding regions 123 as well. The forming of the first via holes 131 of ILD requires a series of processes such as Photoresist (PR) coating, exposure, development and dry etching. Due to fabrication errors, sizes of the first via holes 131 of ILD at the boundary of the circuit region (for example, a boundary of the circuit region, close to the gap region) are larger than that of the first via holes 131 of ILD in the inner side of the circuit region, namely, over-etching will occur, which will eventually result in poor display of a display panel.

At first, arrangements of the present disclosure provide an array substrate. The array substrate can include a circuit region. The circuit region can include a plurality of stacked conductive layers and an interlayer dielectric (ILD) disposed between every two adjacent conductive layers, and first via holes can be provided on the interlayer dielectric (ILD). The array substrate can include a boundary region disposed outside the circuit region. Second via holes for improving uniformity of the first via holes of the circuit region can be disposed within a preset range of the boundary region close to one side of the circuit region. The second via holes and the first via holes can be disposed on the same interlayer dielectric (ILD).

In the array substrate provided by the arrangements of the present disclosure, the second via holes, for example, the second via holes of ILD are disposed in a predetermined range outside the boundary of the circuit region of the array substrate, i.e., a predetermined range of the boundary region close to one side of the circuit region, so that the uniformity of the second via holes of ILD outside the boundary of the circuit region and the first via holes of ILD inside the circuit region can be realized without adding any mask. Therefore, the problem of poor display caused by over-etching of ILD via holes at the boundary of the circuit region will be solved, the passed yield of the array substrate can be increased, and the display effect of the display panel will be improved, so as to reduce the production cost of the array substrate.

In an exemplary arrangement, the first via holes and the second via holes can be interlayer dielectric via holes, i.e., ILD via holes, which are disposed in the interlayer dielectric layer.

It is to be understood that in the following arrangements, explanations will be made by taking examples in which both the first via holes and the second via holes are the ILD via holes, but the present disclosure is not limited thereto. Any other types of via holes that are formed by the same processing, for example, a series of processes such as PR coating, exposure, development and dry etching, etc., may use the technical solution of the present disclosure.

In an exemplary arrangement, the circuit region can include any one or more of a display circuit region, a driver circuit region and an Electro-Static discharge circuit region.

In an exemplary arrangement, the boundary region can include any one or two of a lead region, a fan-out region and a binding region.

In an exemplary arrangement, the circuit region includes a first circuit region and a second circuit region which are disposed adjacent to each other, and the boundary region is a gap region between the first circuit region and the second circuit region.

For example, the first circuit region can be a display circuit region, the second circuit region can be a driver circuit region, and the boundary region is a gap region between the display circuit region and the driver circuit region. However, the present disclosure is not limited thereto.

Figure 2:
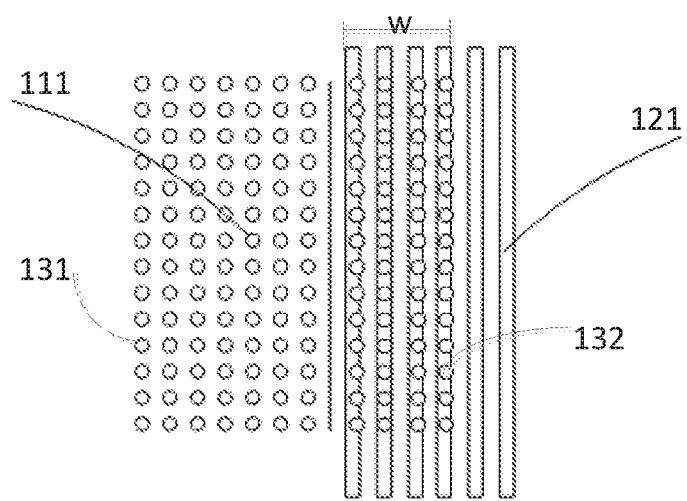
FIG. 2 is a view schematically illustrating an array substrate according to an exemplary arrangement of the present disclosure.

FIG. 2 is a view schematically illustrating an array substrate according to an exemplary arrangement of the present disclosure.

As illustrated in FIG. 2, a plurality of first via holes 131 can be disposed on an ILD layer of a display circuit region 111; and a plurality of second via holes 132 can be disposed on an ILD layer of a lead region 121 outside the display circuit region 111 and close to one side of the display circuit region 111.

In the arrangements of the present disclosure, the first via holes 131 and/or the second via holes 132 can be formed by the following processing: after depositing an ILD layer on an array substrate, coating photoresist (PR) thereon, then, after masking, irradiating the PR with ultraviolet light, and removing the exposed PR using developing solution after the exposure, to form a PR pattern; and then performing Reactive Ion Etching (RIE) to form an ILD via hole pattern.

For example, etching gas can adopts HF, CF4, etc.

The developing solution is a strong alkali solution diluted with water, such as Tetramethylammonium Hydroxide (TMAOH).

In an exemplary arrangement, the plurality of conductive layers can include a source and drain metal layer and a gate metal layer. The interlayer dielectric can be disposed on the source and drain metal layer (SD metal layer) and/or the gate metal layer (Gate metal layer).

For example, the inter layer dielectric can include a first insulating layer and a second insulating layer. The source and drain metal layer can be disposed on the substrate, the first insulating layer can be disposed on the source and drain metal layer, the gate metal layer can be disposed on the first insulating layer, and the second insulating layer can be disposed on the gate metal layer. The present disclosure is not limited thereto.

In the array substrate provided by the arrangement of the present disclosure, the first via holes 131 are formed inside the display circuit region 111, and the second via holes 132 are simultaneously formed in the lead region 121 outside the boundary of the display circuit region 111. Since a layer, in which leads of the lead region 121 are located, is the SD metal layer or the Gate metal layer that has been already formed when the ILD is being formed, so the leads will not be affected. The second via holes 132, such as the second via holes of ILD, are formed in the lead region 121, so that conditions of the first via holes 131, such as the first via holes of ILD, in the inner side and at the boundary of the display circuit region 111 can be the same, thus the first via holes of ILD inside the display circuit region 111 can keep being uniform.

In an exemplary arrangement, the first via holes of the circuit region have the same density as that of the second via holes of the boundary region. It is to be understood that the first via holes of the circuit region having the same density as that of the second via holes of the boundary region herein means that the density of the second via holes in a certain range outside the boundary of the circuit region is substantively the same as that of the first via holes in the corresponding circuit region.

The density of the first via holes can be defined as a ratio of a sum of areas of the first via holes inside the circuit region to a total area of the circuit region, for example, a sum of areas of the first via holes inside the display circuit region to a total area of the circuit region. The density of the second via holes can be defined as a ratio of a sum of areas of the second via holes in the corresponding boundary region to an area of a preset range in which the second via holes are located, for example, a ratio of a sum of areas of the second via holes in the lead region to an area of a preset range of the lead region, in which the second via holes are located.

In an exemplary arrangement, the first via holes in the circuit region may or may not have the same shape as that of the second via holes in the boundary region.

In the arrangement illustrated in FIG. 2, the first via holes 131 in the display circuit region 111 and the second via holes 132 in the lead region 121 all have the same circular shape, but the present disclosure is not limited thereto. In other arrangements, the second via holes 132 in the lead region 121 may have a different shape from that of the first via holes 131 in the display circuit region 111.

For example, the shape of the second via holes in the boundary region can be any one or more of a strip shape, a rectangular shape or an irregular shape.

In an exemplary arrangement, when the second via holes in the boundary region have a strip shape, the strip shape may be a straight line or a curved line, and like a groove.

In an exemplary arrangement, distribution of the first via holes in the circuit region is the same as that of the second via holes in the boundary region.

In the arrangement illustrated in FIG. 2, the shape, distribution and density of the first via holes 131 in the display circuit region 111 are the same as those of the second via holes 132 in the lead region 121, thus the uniformity of ILD via holes in the circuit region of the array substrate can be further improved, thus realizing a better display effect.

In an exemplary arrangement, the circuit region can include a plurality of pixels or sub-pixels. A width of the preset range can be set to be larger than that of a first edge of the pixels or sub-pixels (such as their short edge).

For example, in the arrangement illustrated in FIG. 2, the preset range of the second via holes 132 in the lead region 121 has a width w, which can be set as being larger than the width of the short edge of the pixels or sub-pixels.

The value range of the width of the preset range, in which the second via holes are located, is related to the accuracy and uniformity of exposure, development and dry etching for forming the via holes as well as the viscosity of the developing solution, but it has no direct relation with the area or edge length the circuit region, and there will be beneficial effect on the via holes that play normal roles (that is, the first via holes described above), as long as dummy via holes (that is, the second via holes described above) are provided.

Figure 3:
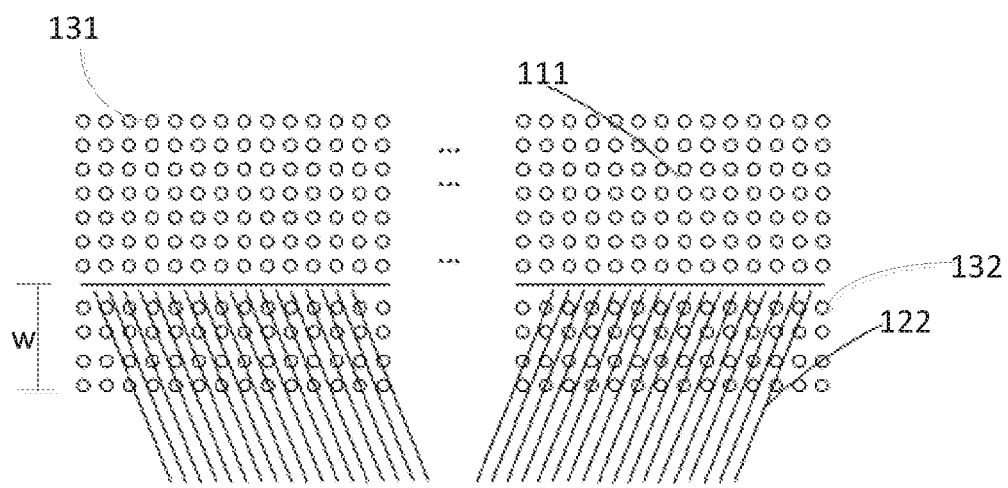
FIG. 3 is a view schematically illustrating an array substrate according to another exemplary arrangement of the present disclosure.

FIG. 3 is a view schematically illustrating an array substrate according to another exemplary arrangement of the present disclosure.

As illustrated in FIG. 3, a plurality of first via holes 131 can be disposed in a display circuit region 111; and second via holes 132 can be disposed in a preset range of a fan-out region 122 close to one side of the display circuit region 111 and outside the display circuit region 111. A width of the preset range, in which the second via holes 132 are disposed, is w. Namely, ILD via holes can be formed in the fan-out region 122 as well, for the same reasons as those in the above arrangement illustrated in FIG. 2.

Similarly, in other arrangements, a certain number of second via holes such as the second via holes of ILD can be disposed outside a boundary of other regions, in which first via holes such as the first via holes of ILD need to be provided, such as a driver circuit region, an ESD region, etc., as well, to realize the aforementioned effects.

The exemplary arrangement of the disclosure further provides a display panel including the array substrate described in any of the above arrangements.

In an exemplary arrangement, the display panel can be an OLED display panel. Since the OLED display panel has a complex array structure, its corresponding process flows are more complicated, and its ILD via holes have a much larger density than that of a LCD display panel which has the same PPI (Pixels Per Inch) as that of the OLED display panel. However, the present disclosure is not limited thereto, but can be applied on, for example, an LCD display panel or any other kinds of display panels formed by the same process.

The display panel has the same technical features and working principles as those of the above array substrate, and the above contents have been described in detail, thus details thereof will not be described herein again.

This exemplary arrangement further provides a display device including the display panel described in any of the above arrangements.

Other arrangements of the utility model will be apparent to those skilled in the art from consideration of the specification and practice of the utility model disclosed here. This application is intended to cover any variations, uses, or adaptations of the utility model following the general principles thereof and including such departures from the present disclosure as come within known or customary practice in the art. It is intended that the specification and examples be considered as exemplary only, with a true scope and spirit of the utility model being indicated by the following claims.

The exemplary arrangements of the present disclosure have been specifically illustrated and described above. It should be understood that the present disclosure is not limited to the detailed structures, arrangements or implementations described herein; rather, the present disclosure is intended to cover various modifications and equivalents that fall within the spirit and scope of the appended claims.

What is claimed is:

1. An array substrate, comprising:
    a circuit region, comprising a plurality of pixels or sub-pixels, a plurality of stacked conductive layers and an interlayer dielectric disposed between every two adjacent ones of the plurality of conductive layers, wherein first via holes are provided on the interlayer dielectric; and
    a boundary region, disposed outside the circuit region, wherein second via holes are disposed within a preset range of the boundary region close to one side of the circuit region, and a width of the preset range is larger than that of a first edge of the pixels or sub-pixels,
    wherein the second via holes and the first via holes are disposed on the same interlayer dielectric.

2. The array substrate according to claim 1, wherein the first via holes in the circuit region and the second via holes in the boundary region have a same density.

3. The array substrate according to claim 1, wherein the first via holes in the circuit region the second via holes in the boundary region have a same shape or different shapes.

4. The array substrate according to claim 3, wherein a shape of the second via holes in the boundary region is at least one of: a circular shape, a strip shape or a rectangular shape.

5. The array substrate according to claim 2, wherein the first via holes in the circuit region and the second via holes in the boundary region have a same distribution.

6. The array substrate according to claim 1, wherein the circuit region further comprises any one or more of a driver circuit region and an electro-static discharge circuit region.

7. The array substrate according to claim 1, wherein the boundary region comprises any one or two of a lead region, a fan-out region and a binding region.

8. The array substrate according to claim 1, wherein the circuit region comprises a first circuit region and a second circuit region which are disposed adjacent to each other, and the boundary region is a gap region between the first circuit region and the second circuit region.

9. The array substrate according to claim 1, wherein the plurality of conductive layers comprise:
    a source and drain metal layer and a gate metal layer,
        wherein the interlayer dielectric is disposed on the source and drain metal layer and/or the gate metal layer.

10. A display panel, comprising the array substrate according to claim 1.

11. The display panel according to claim 10, wherein the display panel is an OLED display panel.

12. A display device, comprising the array panel according to claim 10.

13. A method for manufacturing an array substrate, wherein the array substrate comprises a circuit region and a boundary region disposed outside the circuit region, the circuit region comprises a plurality of pixels or sub-pixels, a plurality of stacked conductive layers and an interlayer dielectric disposed between every two adjacent ones of the plurality of conductive layers, and the method comprises:
    providing first via holes on the interlayer dielectric; and
    disposing second via holes in the circuit region within a preset range of the boundary region close to one side of the circuit region, wherein a width of the preset range is larger than that of a first edge of the pixels or sub-pixels,
    wherein the second via holes and the first via holes are disposed on the same interlayer dielectric.

14. The method according to claim 13, wherein the first via holes in the circuit region and the second via holes in the boundary region have a same density.

15. The method according to claim 13, wherein the first via holes in the circuit region and the second via holes in the boundary region have a same shape or different shapes.

16. The method according to claim 13, wherein a shape of the second via holes in the boundary region includes at least one of a circular shape, a strip shape and a rectangular shape.

17. The method according to claim 14, wherein the first via holes in the circuit region and the second via holes in the boundary region have a same distribution.

18. The method according to claim 13, wherein the circuit region further comprises any one or more of a driver circuit region and an electro-static discharge circuit region.

19. The method according to claim 13, wherein the boundary region comprises any one or two of a lead region, a fan-out region and a binding region.

\* \* \* \* \*